(12) United States Patent
Dickey et al.

(10) Patent No.: US 10,250,033 B2
(45) Date of Patent: Apr. 2, 2019

(54) TRANSIENT VOLTAGE SUPPRESSOR HAVING BUILT-IN-TEST CAPABILITY FOR SOLID STATE POWER CONTROLLERS

(71) Applicant: Hamilton Sundstrand Corporation, Charlotte, NC (US)

(72) Inventors: John A. Dickey, Caledonia, IL (US); Donald G. Kilroy, Rockford, IL (US); Josh C. Swenson, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 456 days.

(21) Appl. No.: 14/955,986

(22) Filed: Dec. 1, 2015

(65) Prior Publication Data
US 2017/0155244 A1 Jun. 1, 2017

(51) Int. Cl.
| | | |
|---|---|---|
| *H02H 9/04* | (2006.01) | |
| *H02H 9/00* | (2006.01) | |
| *H02H 3/04* | (2006.01) | |
| *H02H 7/26* | (2006.01) | |
| *H03K 17/0814* | (2006.01) | |
| *H03K 17/74* | (2006.01) | |
| *G01R 31/28* | (2006.01) | |

(Continued)

(52) U.S. Cl.
CPC ......... *H02H 9/042* (2013.01); *G01R 31/2827* (2013.01); *H02H 3/044* (2013.01); *H02H 3/048* (2013.01); *H02H 7/268* (2013.01); *H02H 9/041* (2013.01); *H02H 9/049* (2013.01); *H03K 17/08142* (2013.01); *H03K 17/74* (2013.01); *B64D 2221/00* (2013.01); *G01R 31/2632* (2013.01); *G01R 31/3277* (2013.01)

(58) Field of Classification Search
CPC ........ H02H 9/042; H02H 9/005; H02H 3/044; H02H 3/048; H02H 7/268; H02H 9/041; G01R 31/3277; G01R 31/2632; B64D 2221/00
See application file for complete search history.

(56) References Cited

U.S. PATENT DOCUMENTS

| | | | |
|---|---|---|---|
| 6,421,220 B2 * | 7/2002 | Kobsa ...................... | H02H 9/06 361/117 |
| 7,304,872 B1 * | 12/2007 | Yakymyshyn .......... | H02M 5/06 307/140 |
| 7,626,797 B2 | 12/2009 | Kilroy et al. | |

(Continued)

FOREIGN PATENT DOCUMENTS

| | | |
|---|---|---|
| EP | 2207245 A2 | 7/2010 |
| EP | 2479860 A2 | 7/2012 |
| EP | 3185384 A1 | 6/2017 |

*Primary Examiner* — Zeev V Kitov
(74) *Attorney, Agent, or Firm* — Cantor Colburn LLP

(57) ABSTRACT

Embodiments are directed to a transient protection circuit configured for use in a SSPC having a plurality of power channels. The transient protection circuit includes a shared transient voltage suppressor, and a shared protection line communicatively coupled to the shared transient voltage suppressor. The shared protection line is configured to be communicatively coupled to and shared by the plurality of power channels. When the shared protection line is communicatively coupled to and shared by the plurality of power channels, energy above a threshold on any one of the plurality of power channels is dissipated through the shared protection line and the shared transient voltage suppressor.

16 Claims, 3 Drawing Sheets

(51) Int. Cl.
   *G01R 31/327* (2006.01)
   *G01R 31/26* (2014.01)

(56) References Cited

U.S. PATENT DOCUMENTS

| | | |
|---|---|---|
| 8,203,815 B2 | 6/2012 | Kilroy et al. |
| 8,598,899 B2 | 12/2013 | Hess |
| 9,500,699 B2 | 11/2016 | Thomas |
| 2005/0047048 A1 | 3/2005 | Chin et al. |
| 2006/0181833 A1* | 8/2006 | Brown ............... H02H 9/042 361/124 |
| 2012/0153963 A1* | 6/2012 | Tyler ............... G01R 31/3277 324/537 |
| 2013/0049465 A1* | 2/2013 | Rozman ............... H02J 1/14 307/35 |
| 2013/0329329 A1 | 12/2013 | Liu et al. |
| 2014/0306714 A1 | 10/2014 | Hess et al. |
| 2014/0340799 A1 | 11/2014 | Gray |
| 2015/0123622 A1 | 5/2015 | Yasui |
| 2015/0162743 A1* | 6/2015 | Kashyap ............ H01L 27/0248 361/91.5 |
| 2015/0270706 A1 | 9/2015 | Mehl |
| 2016/0050724 A1* | 2/2016 | Moon ............... H05B 33/089 315/200 R |

\* cited by examiner

TRANSIENT VOLTAGE SUPPRESSOR HAVING BUILT-IN-TEST CAPABILITY FOR SOLID STATE POWER CONTROLLERS

BACKGROUND OF THE DISCLOSURE

The present disclosure relates generally to the use of transient voltage suppression (TVS) diodes to protect aircraft power control circuitry and their components from transient power surges. More specifically, the present disclosure relates to TVS diode-based protection schemes that facilitate the efficient and cost effective protection of solid state power controller (SSPC) components from exposure to overvoltage conditions caused by lightning-induced pulses and other transient events, while also facilitating the efficient and cost effective incorporation of built-in-test (BIT) circuitry for TVS diode failure detection.

Vehicles, such as aircraft, typically include miles of wires and dozens of computers and other instruments and systems that control everything from the engines to passenger headsets. One or more power management and distribution (PMD) systems are typically provided to distribute power from a primary source to various vehicle systems. PMD systems often include so-called smart power management and distribution functionality enabled by SSPCs. A typical PMD system may include hundreds or thousands of SSPCs.

Aircraft computers and electrical systems, including PMD systems and their SSPCs, must be able to safely withstand overvoltage conditions and other transients that can result from a lightning strike. Traditionally, aircraft had an aluminum skin that attenuated the lightning current induced on the wires. Some aircraft now use composite materials instead of aluminum for weight and strength benefits. However, composite materials do not provide the same level of attenuation to lightning as aluminum. When lightning occurs, hundreds of volts may surge between a load in the vehicle system and the aircraft chassis. As such, the lightning requirements of PMD systems and their SSPCs have increased.

SSPCs generally use microprocessors to manage the operation of high-efficiency switching MOSFETs, which perform on/off control of the load and protect loads from short circuit and overload conditions. When these MOSFETs are subjected to lightning-induced power surges and other transients that are higher than the MOSFET voltage ratings and they are OFF, the MOSFETs break down and conduct, which typically results in the MOSFET being damaged or destroyed.

It is known to use TVS diodes to protect the MOSFET switches of an SSPC from lightning-induced power surges and other transients. TVS diodes provide protection to MOSFETs by shunting excess current when the lightning-induced voltage exceeds the diode avalanche breakdown potential. TVS diodes are, in effect, clamping devices that suppress all voltages above their breakdown voltages, and they automatically reset when the overvoltage goes away. A TVS diode may be either unidirectional or bidirectional. A unidirectional TVS diode operates as a rectifier in the forward direction like any other avalanche diode but is made and tested to handle very large peak currents.

Known TVS diode-based protection schemes for SSPC MOSFET switches require an individual TVS diode for every SSPC output channel. As the complexity of SSPCs for aircraft applications increases, a single SSPC card can include 40 or more output channels, which, following known transient protection schemes, would require 40 individual TVS diodes per SSPC card. Additionally, although TVS diodes have sufficient functionality to provide the necessary transient protection, known TVS designs exhibit dormant failures. Existing SSPCs that utilize TVS diode-based protection transient protection schemes do not have a way of testing the full functionality of its protection circuitry without removing the module containing the protection circuitry from the aircraft itself. As a result, the functionality of the protection circuitry is determined during maintenance and assumed to be maintained until the next maintenance. Verification is then performed at the next maintenance when the module is removed from the aircraft. Hidden or dormant TVS diode failures are not immediately evident to operations and maintenance personnel as soon as they occur, so the detection of such dormant failures require a specific action (e.g., a periodic application of BIT circuitry) in order for the dormant failure to be identified. Providing the necessary BIT circuitry to test 40 or more TVS diodes per SSPC card for dormant failures is complicated and typically cost prohibitive.

It is therefore desirable to provide a TVS diode-based protection schemes that facilitates the simple, efficient and cost effective protection of SSPC power channels and components from exposure to overvoltage conditions caused by lightning-induced pulses and other transient events, while also facilitating the efficient and cost effective incorporation of BIT circuitry for identifying dormant TVS diode failures.

BRIEF DESCRIPTION OF THE DISCLOSURE

Embodiments are directed to a lightning protection circuit configured for use in a module having a plurality of SSPC power channels. The lightning protection circuit includes a shared transient voltage suppressor, and a shared protection line communicatively coupled to the shared transient voltage suppressor. The shared protection line is configured to be communicatively coupled to and shared by the plurality of power channels. When the shared protection line is communicatively coupled to and shared by the plurality of power channels, energy above a threshold on any one of the plurality of power channels is dissipated through the shared protection line and the shared transient voltage suppressor.

Embodiments are further directed to a transient protection circuit configured for use a SSPC having a feed line communicatively coupled to a plurality of power channels. The transient protection circuit includes a shared transient voltage suppressor, a transient voltage suppression (TVS) diode in series with a non-TVS diode, and a shared protection line communicatively coupled to the shared transient voltage suppressor. The shared protection line is configured to be communicatively coupled to and shared by the plurality of power channels, and the non-TVS diode is configured to be communicatively coupled to the feed line. When the shared protection line is communicatively coupled to and shared by the plurality of power channels, energy above a threshold on any one of the plurality of power channels is dissipated through the shared protection line and the shared transient voltage suppressor. Additionally, at least a portion of energy above another threshold on the feed line passes through the non-TVS diode and is dissipated through the TVS diode.

Embodiments are further directed to a method of forming a lightning protection circuit configured for use in a module having a plurality of SSPC power channels. The method includes forming a shared transient voltage suppressor, forming a shared protection line communicatively coupled to the shared transient voltage suppressor, and configuring the shared protection line to be communicatively coupled to and shared by the plurality of power channels. When the shared protection line is communicatively coupled to and shared by the plurality of power channels, energy above a threshold on any one of the plurality of power channels is dissipated through the shared protection line and the shared transient voltage suppressor.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter of the present disclosure is particularly pointed out and distinctly claimed in the claims at the conclusion of the specification. The foregoing and other features, and advantages of the present disclosure are apparent from the following detailed description taken in conjunction with the accompanying drawings in which:

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION OF THE DISCLOSURE

Figure 1:
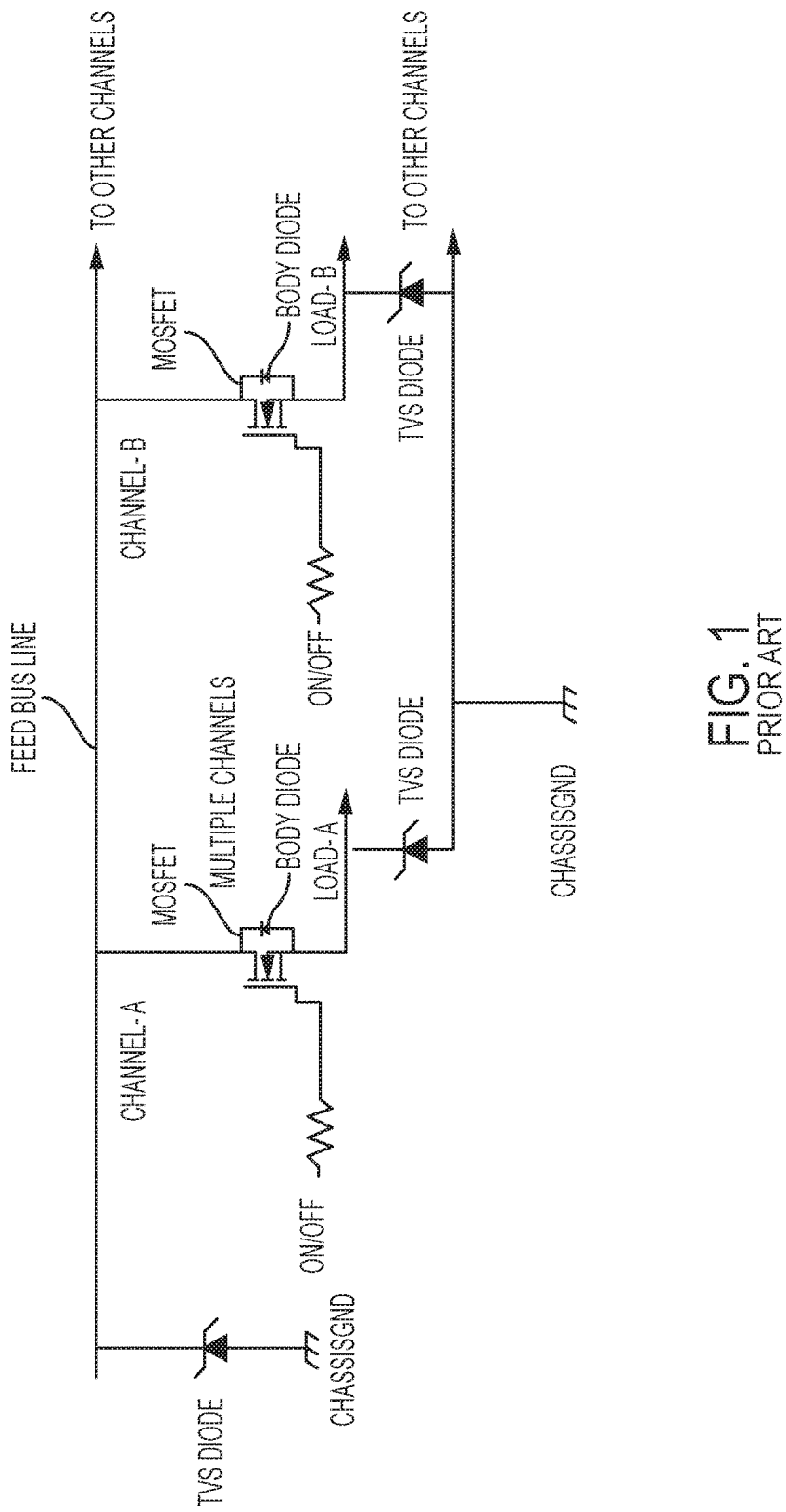
FIG. 1 depicts a known TVS diode-based protection scheme.
Figure 2:
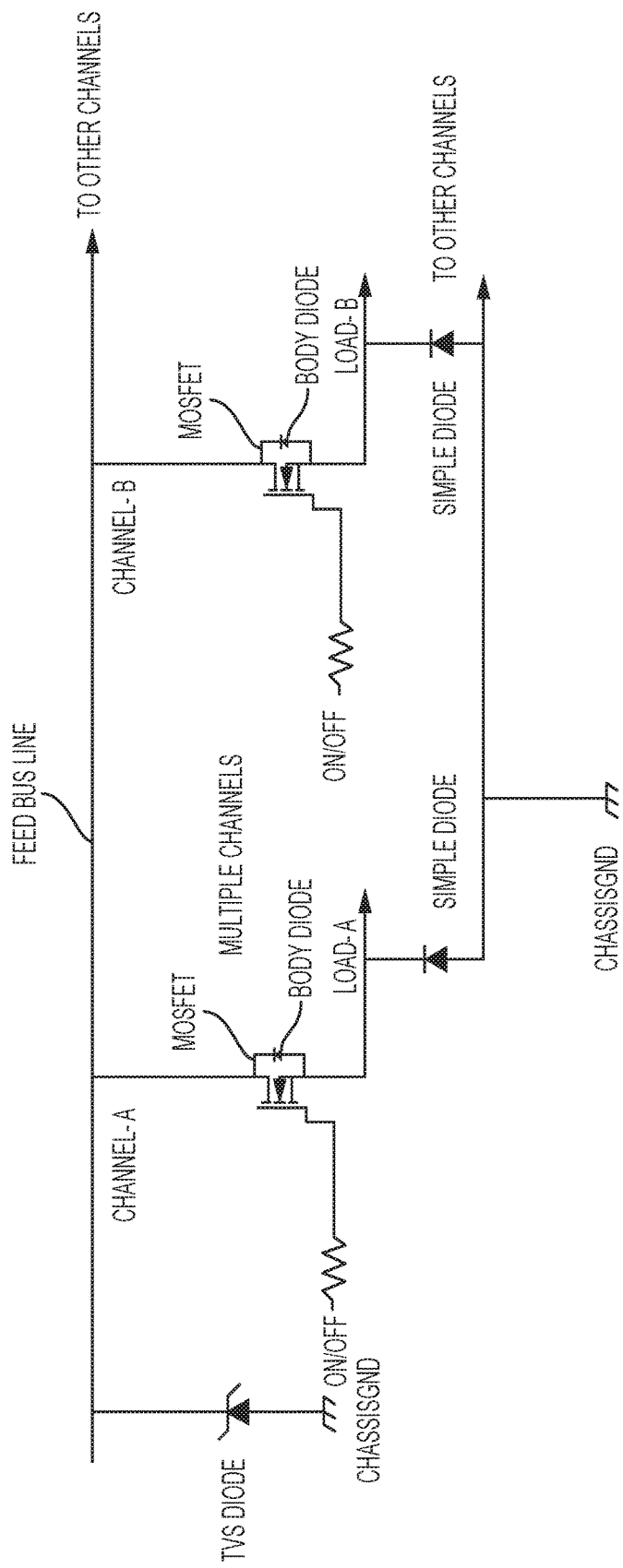
FIG. 2 depicts a known non-TVS diode-based protection scheme.

Turning now to an overview of the present disclosure, PMD systems generally include modules that each includes multiple SSPC power channels. Each power channel has an input feed line, an output load and a power MOSFET that selectively couples the feed voltage to the output load when turned on. When the power MOSFET switch of a given channel is subjected to a voltage transient (e.g., a lightning induced transient) that is higher than the MOSFET voltage rating limit and it is OFF, the MOSFET will break down and conduct and usually be damaged or destroyed. Existing transient protection/suppression systems, examples of which are shown in FIGS. 1 and 2, provide transient protection. However, as the number of channels provided on an SSPC card continues to increase (e.g., up to about 40 SSPC channels per SSPC card), the complexity, cost and card area required to implement existing transient protection schemes continue to increase as well.

In one or more embodiments of the present disclosure, instead of providing individual TVS diodes for each power channel, a shared transient voltage suppressor is provided in communication with a shared protection line coupled to each individual power channel. Transient energy above a threshold (e.g., above the MOSFET voltage rating limit) on any one of the multiple SSPC power channels is dissipated through the shared transient voltage suppressor. In one or more embodiments, the shared transient voltage suppressor includes a single TVS diode. In one or more embodiments, the shared transient voltage suppressor includes a plurality of simple diodes and a single TVS diode. In one or more embodiments, the shared transient voltage suppressor includes a TVS diode circuit having multiple TVS diodes, wherein the number of TVS diodes is less than the number of power channels. In any of the disclosed shared transient voltage suppressors, the reliance on TVS diodes, which provide the necessary voltage suppression functionality but exhibit dormant failures, is reduced by sharing either one or a few (i.e., less than the number of power channels) TVS diodes among a plurality of power channels.

Because the present disclosure significantly reduces the number of TVS diodes that are required to provide protection from lightning-induced and other transients, the present disclosure makes it efficient and cost effective to provide a BIT circuit to test the disclosed shared transient voltage suppressor for dormant failures. The BIT circuit applies a pulsed BIT signal to the shared transient voltage suppressor and measures the resulting voltage across the shared transient voltage suppressor. The BIT signal applied to the shared transient voltage suppressor is a voltage (positive or negative) to verify that the shared transient voltage suppressor is clamping at a proper value. Because of the significant reduction in the number of TVS diodes that are required to provide protection from lightning-induced and other transients, the added cost/area of providing a BIT circuit is relatively small. Additionally, for embodiments wherein the shared transient voltage suppressor is augmented by or supplemented with simple diodes (e.g., one simple diode per channel), the simple diodes prevent BIT circuit test pulses applied to the shared protection line from affecting the normal operating outputs of the channels.

Lightning-induced transients may occur as a positive or negative pulse on the feed line side of a channel or as a positive or negative pulse on the load side of a channel. Accordingly, a BIT circuit of the present disclosure may be provided on the feed line side of a channel or on the load side of a channel, or on both the feed side and load side of a channel. When provided on the load line side of a channel, the BIT circuit tests with a negative voltage on the load line side shared protection line. When provided on the feed line side of a channel, the BIT circuit tests with a positive voltage at the cathode of the shared transient voltage suppressor. Additionally, because the actual transients on the feed line or the load line can vary, the disclosed transient suppression schemes may or may not include the same voltage threshold for the TVS diodes on the feed side and the load side.

Turning now to a more detailed description of the drawings, FIG. 1 depicts a known TVS diode-based protection scheme, and FIG. 2 depicts a known non-TVS diode-based protection scheme. In either FIG. 1 or FIG. 2, the protection scheme includes multiple power channels, only two of which are shown for ease of illustration. Each power channel is coupled to a FEED BUS LINE and a Load Line and includes a MOSFET switch, a MOSFET body diode, a LOAD, a ON/OFF MOSFET control line coupled at one end through a resistor to the MOSFET gate and coupled at its other end to a gate drive (not shown). Each channel further includes an output line (i.e., the Load Line) having thereon either a TVS diode (FIG. 1) or a simple diode (FIG. 2).

As shown in FIG. 1, in the normal operation of the MOSFET switches, the FEED BUS LINE feeds power into Channel-A through the MOSFET switch and the Load Line into LOAD-A. A lightning-induced pulse or other transient on either the FEED BUS LINE or through the Load Line of Channel-A forces a positive or negative voltage on the FEED BUS LINE or a positive or negative voltage on the Load Line. In either case, large currents attempt to flow through the MOSFET switch. If for example a positive transient is on the Load Line of Channel-A in FIG. 1, the transient will conduct through the MOSFET body diode until the TVS diode reaches its breakdown voltage at which point it conducts the excess to Chassis Ground (Chassisgnd), which in effect shunts the high levels of transient current away from the MOSFET. The TVS diode shunts transient current by providing a low resistance path for current to pass through the TVS diode. This also limits the voltage increase at the FEED BUS LINE for cases wherein the FEED BUS LINE has high source impedance.

The anode of the TVS diode shown in FIG. 1 is tied to Chassisgnd, and the cathode of the TVS diode is tied to the Load Line. Accordingly, the Load Line has to reach the breakdown voltage of the TVS diode in order for the TVS diode to conduct. Thus, from the Load Line side of the TVS diode, the voltage rating of the TVS diode for a typical aircraft application would be approximately 48V. For negative load transients, the TVS diode in FIG. 1 functions as a simple diode and the voltage drop across the TVS diode would be approximately 1 V.

A drawback to the approach in FIG. 1 is that because the negative transient is clamped to a small value such as 1V, inductive loads take much longer to de-energize when the SSPC MOSFET turns off. For relay or contactor coil loads, this longer time allows more contact arcing, which adversely impacts the relay or contactor reliability. For this reason the unidirectional TVS device configuration shown in FIG. 1 is not preferred. Accordingly, some applications chose to use bidirectional TVS devices sized at a voltage rating with margin below the rating of the MOSFET devices.

In FIG. 2, the TVS diode is replaced with a Simple Diode. The Simple Diode blocks the transient current in one direction but does not provide that breakdown voltage protection that is provided by the TVS diode shown in FIG. 1. Accordingly, the Simple Diode typically has a relatively large voltage rating. For example, in a typical aircraft application, the Simple Diode of FIG. 2 would be approximately 600V. Although simple, the drawback to the approach in FIG. 2 is that because the negative transient is clamped to a small value such as 1V, inductive loads take much longer to de-energize when the SSPC MOSFET turns off. For relay or contactor coil loads, this longer time allows more contact arcing, which adversely impacts the relay or contactor reliability. Accordingly, simple diodes on SSPC outputs as shown in FIG. 2 are not preferred.

Figure 3:
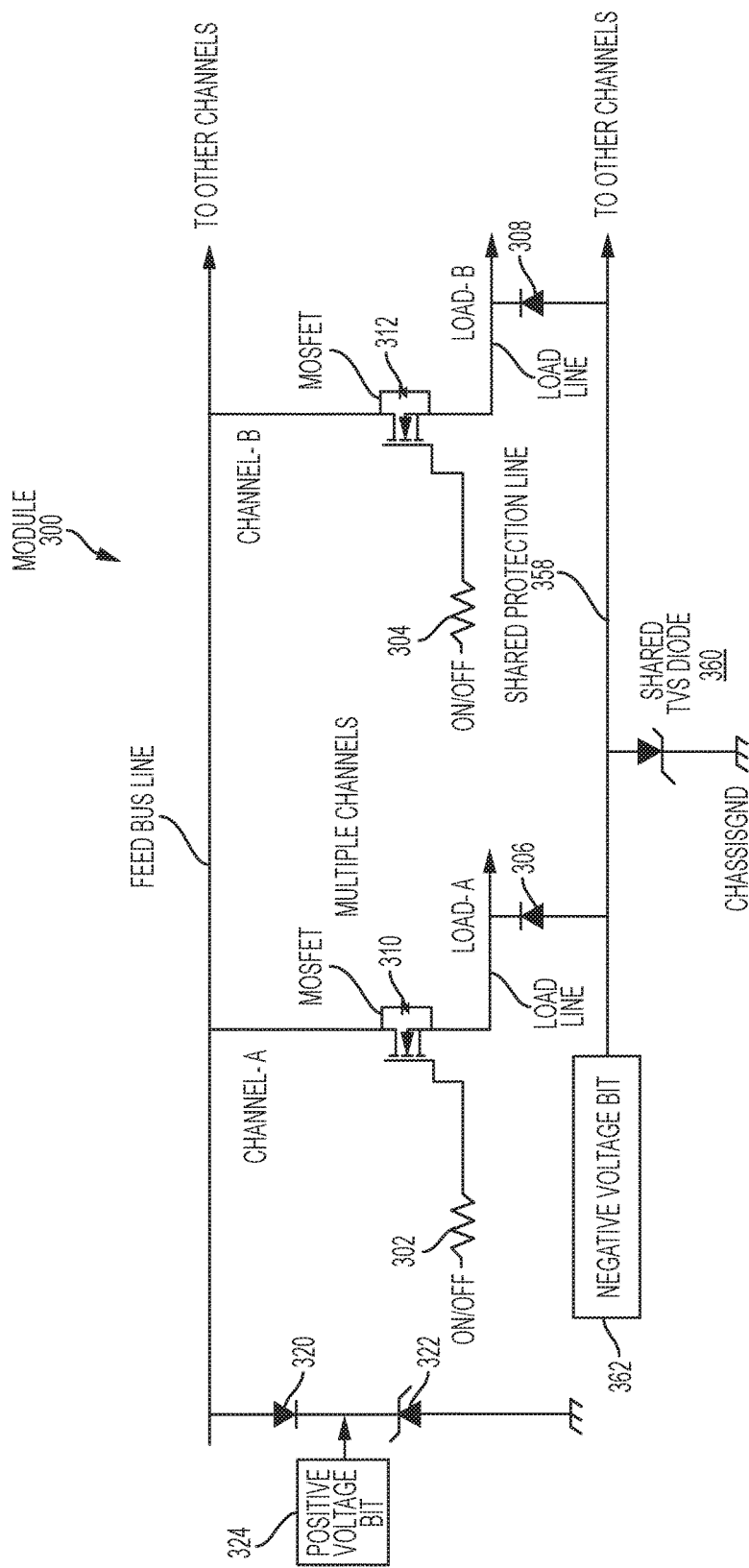
FIG. 3 depicts a shared transient voltage suppressor and BIT circuit configuration according to one or more embodiments.

Turning now to a more detailed description of the present disclosure, FIG. 3 depicts selected portions of a SSPC module 300 having a shared protection line 358, a shared transient voltage suppressor 360 and a BIT circuit 362 according to one or more embodiments. In terms of its overall functionality, module 300 may be part of a PMD system utilized to control power management and distribution on a vehicle, such as an aircraft (not shown). Under some conditions, such as a lightning strike, a transient current may surge through the vehicle. The transient current may be, for example, an induced current, other known type of transient current, or a transient current from another source besides lightning. In the disclosed example, shared protection line 358, shared transient voltage suppressor 360 and BIT circuit 362 of SSPC 300 provide lightning protection to reduce the risk that module 300, and particularly the channel MOSFETS, becomes damaged from the transient current. As will be appreciated from the illustration and the following description, in accordance with one or more disclosed embodiments, shared protection line 358, shared transient voltage suppressor 360 and BIT circuit 362 of module 300 facilitate the simple, efficient and cost effective protection of SSPC power channels and components thereof (e.g., the channel MOSFETs) from exposure to overvoltage conditions caused by lightning-induced pulses and other transient events that exceed a threshold (e.g., the voltage rating limit of the channel MOSFET), while also facilitating the efficient and cost effective incorporation of BIT circuit 362 for identifying dormant TVS diode failure points.

Module 300 couples multiple power channels to multiple loads. For ease of illustration, only two power channels, Channel-A and Channel-B, and two loads, Load-A and Load-B, are shown. In the present disclosure, a description of the operation of one channel applies equally to all channels. Channel-A transmits power down Feed Bus Line-A, through the channel-A MOSFET to Load-A. Lightning strikes can result in transients through Channel-A that exceed the operating range of the channel-A MOSFET.

Lightning-induced and other transients may occur as a positive or negative pulse on the feed line side of Channel-A, or as a positive or negative pulse on the load side of Channel-A. For the embodiment shown in FIG. 3, shared protection line 358, shared transient voltage suppressor 360 and BIT circuit 362 are provided on the load side of Channel-A. Additionally, a TVS diode 322, a simple diode 320 and a BIT circuit 324 are also provided between the FEED BUS LINE and Chassisgnd. BIT circuit 362 tests with a negative voltage across shared transient voltage suppressor 360. BIT circuit 324 tests with a positive voltage on TVS diode 322.

Channel-A couples power on the FEED BUS LINE through a channel-A MOSFET having an intrinsic body diode 310 and an ON/OFF MOSFET control line coupled at one end through a resistor 302 to the channel-A MOSFET and coupled at its other end to a functional gate driver (not shown). From the channel-A MOSFET, power is coupled through the Load Line to LOAD-A. A simple diode 306 is coupled between the Load Line and shared protection line 358, which is coupled to and shared by all channels of module 300. Shared TVS diode 360 is coupled between shared protection line 358 and Chassisgnd. Shared TVS diode 360 increases the clamping voltage and addresses the reliability concern with simple diode clamping (provided by simple diode 306) when interfacing to inductive loads such as relays and contactors. Through its coupling to shared protection line 358, shared TVS diode 360 is coupled to and shared by all channels of module 300.

As shown in FIG. 3, shared protection line 358 sits between simple diode 306 and shared TVS diode 360. Shared protection line 358A is a "protected line" in that it can never go more than the value of the voltage across shared TVS diode 360 below Chassisgnd. Because simple diode 306 is connected between shared protection line 358A and LOAD-A, when a negative transient is present on the Load Line and the channel-A MOSFET is off, simple diode 306 conducts and applies the negative transient voltage to shared protection line 358. When shared protection line 358 reaches the breakdown voltage of shared TVS diode 360, TVS diode 360 starts to conduct and carries current through shared TVS diode 360 over shared protection line 358 through simple diode 306 and out to LOAD-A, thereby clamping the negative overvoltage. Accordingly, for a negative lightning-induced transient pulse, the channel-A MOSFET stays off and all of the transient energy is dissipated by shared protection line 358, simple diode 306 and shared TVS diode 360.

When a positive transient is present on the Load Line and the channel-A MOSFET is off, the positive transient current goes through body diode 310 of the channel-A MOSFET and goes out through the FEED BUS LINE. Body diode 310 of the channel-A MOSFET is the intrinsic body diode of the channel-A MOSFET based on the structure of the channel-A MOSFET.

BIT circuit 362 is coupled through shared protection line 358 to shared TVS diode 360. To ensure that shared TVS diode 360 does not have a dormant "stuck at" fault, BIT circuit 362 stimulates shared TVS diode 360 to a known value momentarily, and then monitors shared TVS diode 360 for the correct response to the stimulus.

FIG. 3 also depicts feed-side TVS diode 322 in series with simple diode 320 between the FEED BUS LINE and Chassisgnd. Positive transients on the FEED BUS LINE are shunted through simple diode 320 and TVS diode 322. When a negative transient is present on the FEED BUS LINE, the negative transient current goes through the channel-A MOSFET body diode 310 and out through the Load Line.

BIT circuit 324 is coupled between simple diode 320 and TVS diode 322. To ensure that TVS diode 322 does not have a dormant "stuck at" fault, BIT circuit 324 stimulates TVS diode 322 to a known value momentarily, and then monitors TVS diode 322 for the correct response to the stimulus.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure.

Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

The invention claimed is:

1. A transient protection circuit configured for use in a solid state power controller (SSPC) comprising a plurality of power channels, the transient protection circuit comprising:
   a shared transient voltage suppressor communicatively coupled to ground; and
   a shared protection line communicatively coupled to the shared transient voltage suppressor;
   wherein the shared protection line is configured to be communicatively coupled to and shared by the plurality of power channels;
   wherein the plurality of power channels are communicatively coupled to a shared feed line;
   wherein each of the plurality of power channels is communicatively coupled to a non-shared load line;
   wherein, when the shared protection line is communicatively coupled to and shared by the plurality of power channels, positive pulses above a threshold originated from the non-shared load line of any one of the plurality of power channels are dissipated through the any one of the plurality of power channels to the shared feed line;
   wherein, when the shared protection line is communicatively coupled to and shared by the plurality of power channels, negative pulses above a threshold originated from the non-shared load line of any one of the plurality of power channels are dissipated through the shared protection line and the shared transient voltage suppressor.

2. The circuit of claim 1 further comprising:
   a built-in-test (BIT) circuit communicatively coupled to the shared protection line and configured to test the shared transient voltage suppressor to detect a dormant failure of the shared transient voltage suppressor.

3. The circuit of claim 1 further comprising:
   a plurality of channel diodes, wherein the shared protection line is communicatively coupled through one of the plurality of channel diodes to the non-shared load line of any one of the plurality of power channels;
   wherein, when the shared protection line is communicatively coupled to and shared by the plurality of power channels, the negative pulses above the threshold originated from the non-shared load line of any one of the plurality of power channels also pass through a non-shared one of the plurality of the channel diodes according to the following:
   the non-shared one of the plurality of channel diodes passes the negative pulses to the shared protection line; and
   based on the shared protection line reaching a breakdown voltage of the shared transient voltage suppressor, the shared transient voltage suppressor starts to conduct and carries current through the shared transient voltage suppressor, over the shared protection line, through the non-shared one of the plurality of channel diodes, and to the non-shared load line.

4. The circuit of claim 1, wherein the pulses above the threshold are induced by a lightning strike.

5. The circuit of claim 1, wherein:
   the shared transient voltage suppressor comprises a shared transient voltage suppression (TVS) diode.

6. The circuit of claim 5, wherein the lightning protection circuit further comprises:
   a built-in-test (BIT) circuit communicatively coupled to the shared protection line and configured to test the shared TVS diode to detect a dormant failure of the shared TVS diode.

7. A transient protection circuit configured for use in a solid state power controller (SSPC) comprising a feed line communicatively coupled to a plurality of power channels, the transient protection circuit comprising:
   a shared transient voltage suppressor communicatively coupled to ground;
   a transient voltage suppression circuit comprising a transient voltage suppression (TVS) diode in series with a non-TVS diode, wherein the TVS diode is coupled to ground and the non-TVS diode is coupled to a shared feed line; and
   a shared protection line communicatively coupled to the shared transient voltage suppressor;
   wherein the shared protection line is configured to be communicatively coupled to and shared by the plurality of power channels;
   wherein the plurality of power channels are communicatively coupled to the shared feed line;
   wherein each of the plurality of power channels is communicatively coupled to a non-shared load line;
   wherein, when the shared protection line is communicatively coupled to and shared by the plurality of power channels, positive pulses above a threshold originated from the non-shared load line of any one of the plurality of power channels is dissipated through the any one of the plurality of power channels and the shared feed line to the transient voltage suppression circuit;
   wherein, when the shared protection line is communicatively coupled to and shared by the plurality of power channels, negative pulses above a threshold originated from the non-shared load line of any one of the plurality of power channels are dissipated through the shared protection line and the shared transient voltage suppressor.

8. The circuit of claim 7 further comprising:
   a first built-in-test (BIT) circuit communicatively coupled to the shared protection line and configured to test the shared transient voltage suppressor to detect a dormant failure of the shared transient voltage suppressor; and
   a second BIT circuit communicatively coupled to the TVS diode and configured to test the TVS diode to detect a dormant failure of the TVS diode.

9. A method of forming a transient protection circuit configured for use in a solid state power controller (SSPC) comprising a plurality of power channels, the method comprising:
   forming a shared transient voltage suppressor communicatively coupled to ground;
   forming a shared protection line communicatively coupled to the shared transient voltage suppressor; and
   configuring the shared protection line to be communicatively coupled to and shared by the plurality of power channels;
   configuring the plurality of power channels to be communicatively coupled to a shared feed line;
   configuring each of the plurality of power channels to be communicatively coupled to a non-shared load line;
   wherein, when the shared protection line is communicatively coupled to and shared by the plurality of power channels, positive pulses above a threshold originated from the non-shared load line of any one of the plurality of power channels are dissipated through the any one of the plurality of power channels to the shared feed line;
   wherein, when the shared protection line is communicatively coupled to and shared by the plurality of power channels, negative pulses above a threshold originated from the non-shared load line of any one of the plurality of power channels are dissipated through the shared protection line and the shared transient voltage suppressor.

10. The method of claim 9 further comprising:
    forming a built-in-test (BIT) circuit;
    configuring the BIT circuit to be communicatively coupled to the shared protection line; and
    further configuring the BIT circuit to test the shared transient voltage suppressor to detect a dormant failure of the shared transient voltage suppressor.

11. The method of claim 9 further comprising:
    communicatively coupling a feed line to the plurality of power channels;
    forming a transient voltage suppression (TVS) diode in series with a non-TVS diode; and
    communicatively coupling the non-TVS diode to the feed line;
    wherein, when the shared protection line is communicatively coupled to and shared by the plurality of power channels, positive pulses above a threshold originated from the non-shared load line of any one of the plurality of power channels are dissipated through the any one of the plurality of power channels through the shared feed line to the non-TVS diode in series with the TVS diode.

12. The method of claim 10 further comprising:
    forming another BIT circuit;
    communicatively coupling the another BIT circuit to the TVS diode; and
    configuring the another BIT circuit to test the TVS diode to detect a dormant failure of the TVS diode.

13. The method of claim 9 further comprising:
    forming a plurality of channel diodes; and
    configuring the shared protection line to be communicatively coupled through one of the plurality of channel diodes to the non-shared load line of any one of the plurality of power channels;
    wherein, when the shared protection line is communicatively coupled to and shared by the plurality of power channels, negative pulses above the threshold originated from the non-shared load line of any one of the plurality of power channels is also pass through a non-shared one of the plurality of the channel diodes according to the following:
    the non-shared one of the plurality of channel diodes passes the negative pulses to the shared protection line; and
    based on the shared protection line reaching a breakdown voltage of the shared transient voltage suppressor, the shared transient voltage suppressor starts to conduct and carries current through the shared transient voltage suppressor, over the shared protection line, through the non-shared one of the plurality of channel diodes, and to the non-shared load line.

14. The method of claim 9, wherein the positive pulses and the negative pules above the threshold are induced by a lightning strike.

15. The method of claim 9, wherein:
    the shared transient voltage suppressor comprises a shared transient voltage suppression (TVS) diode.

16. The method of claim 15 further comprising:
    forming a built-in-test (BIT) circuit;
    configuring the BIT circuit to be communicatively coupled to the shared protection line; and
    further configuring the BIT circuit to test the shared TVS diode to detect a dormant failure of the shared TVS diode.

* * * * *